United States Patent
Wu et al.

(10) Patent No.: US 7,057,468 B2
(45) Date of Patent: Jun. 6, 2006

(54) CRYSTAL OSCILLATOR CIRCUIT WITH ACTIVATION CONTROL

(75) Inventors: Jeng-Huang Wu, Zhubei (TW); Sheng-Hua Chen, Kaohsiung (TW)

(73) Assignee: Faraday Technology Corp., Hsin-Chu (TW)

( * ) Notice: Subject to any disclaimer, the term of this patent is extended or adjusted under 35 U.S.C. 154(b) by 56 days.

(21) Appl. No.: 10/876,083

(22) Filed: Jun. 24, 2004

(65) Prior Publication Data

US 2005/0285689 A1 Dec. 29, 2005

(51) Int. Cl.
*H03B 1/00* (2006.01)
*H03L 5/00* (2006.01)
*G06F 1/04* (2006.01)

(52) U.S. Cl. .................. 331/74; 331/182; 327/291; 327/299

(58) Field of Classification Search .............. 331/74, 331/175, 182; 327/291, 299
See application file for complete search history.

(56) References Cited

U.S. PATENT DOCUMENTS

| 5,568,100 | A | * | 10/1996 | Locanthi ................. 331/74 |
| 5,774,006 | A | * | 6/1998 | Barel et al. ............. 327/291 |
| 6,803,833 | B1 | * | 10/2004 | Yen et al. ............... 331/175 |

* cited by examiner

*Primary Examiner*—Robert J. Pascal
*Assistant Examiner*—James Goodley
(74) *Attorney, Agent, or Firm*—Winston Hsu

(57) ABSTRACT

A CMOS Pierce crystal oscillator. A clock generator with activation control, for generating a clock signal. The clock generator comprises an amplifier, a shaping circuit and a diagnostic circuit. The amplifier is capable of being coupled to an external oscillation source through an input pad and an output pad to generate an oscillating signal, the shaping circuit is capable of being coupled to the output pad, for shaping the oscillating signal to generate a clock signal, and the diagnostic circuit is capable of being coupled to the output pad, for asserting a ready signal when amplitude of the oscillating signal exceeds a predetermined portion of a full swing voltage.

14 Claims, 5 Drawing Sheets

CRYSTAL OSCILLATOR CIRCUIT WITH ACTIVATION CONTROL

BACKGROUND

The present invention relates to a complementary metal oxide semiconductor (CMOS) Pierce crystal oscillator, and in particular, to a clock generator with activation control.

FIG. 1a shows a conventional crystal pad 100a, for generating a clock signal. To generate the clock signal, input pad 101 and output pad 103 are coupled to an oscillation source, such as a crystal circuit, such that an oscillating signal can be amplified by amplifier 102 and output to shaping circuit 104. The oscillating signal is typically a sinusoidal wave, and the shaping circuit 104 can be a shaping buffer for shaping the oscillating signal to a desired square wave, thereby the circuit 100a functions as a clock generator. Such architecture is very popular, reliable, easy to design and economical, but suffers from some disadvantages such as uncertain start time. As shown in FIG. 1b, conventionally, a counter logic 107 is provided to solve the problem. The counter logic 107 is capable of accumulating square wave transitions, and asserting a ready signal when the total number of transitions meets a predetermined value. The counter design, however, incurs additional cost, and additionally, suffers from problems such as false counting due to glitches, thereby causing systems to crash.

FIG. 1c shows another crystal pad 100b according to the related art. The input pad 101, amplifier 102 and output pad 103 are analogous to FIG. 1a. The shaping circuit 104, however, is substituted by a hysteresis circuit 105, but maintains popularity and reliability, easy of design and low cost. Although when using small hysteresis devices, false counting still prevails if the counter logic 107 exists (as shown in FIG. 1d), and when using large hysteresis devices, unbalanced duty cycles may easily occur due to power bouncing. Large hysteresis devices may also have too large a threshold to push. Therefore, an optimum design for hysteresis circuit 105 is difficult. In FIG. 1d, the counter logic 107 comprises a built-in power on reset (POR) for resetting the counter at power on. The logic, however, is limited to detecting whether the clock generator is ready for use.

SUMMARY

An object of the present invention is to provide a clock generator with activation control, for generating a clock signal. The clock generator comprises an amplifier, a shaping circuit and a diagnostic circuit. The amplifier is capable of being coupled to an external oscillation source through an input pad and an output pad to generate an oscillating signal, the shaping circuit is capable of being coupled to the output pad, for shaping the oscillating signal to generate a clock signal, and the diagnostic circuit is capable of being coupled to the output pad, for asserting a ready signal when amplitude of the oscillating signal exceeds a predetermined portion of a full swing voltage.

The diagnostic circuit comprises a first hysteresis circuit and a ready controller. The first hysteresis circuit detects whether the amplitude of the oscillating signal exceeds the predetermined portion and accordingly generating a result, and the ready controller asserts the ready signal according to the result.

The first hysteresis circuit can be a Schmitt trigger, and the shaping circuit can be a second hysteresis circuit with a lower hysteresis threshold than the first hysteresis circuit.

The clock generator may further comprise a gate for output of the clock signal when the ready signal is asserted and for blocking the clock signal when the ready signal is deasserted. The clock generator may also comprise a switch for disabling the diagnostic circuit when the ready signal is asserted.

Another object of the present invention is to provide a method for generating a clock signal with activation control. The method comprises the following steps. First, an oscillating signal is generated and shaped to produce a clock signal. Thereafter, a diagnostic circuit is provided for detecting amplitude of the oscillating signal, and a ready signal is asserted when the amplitude of the oscillating signal exceeds a predetermined portion of a full swing voltage. Additionally, when the ready signal is asserted, the diagnostic circuit is disabled and the clock signal is output.

BRIEF DESCRIPTION OF THE DRAWINGS

The following detailed description, given by way of example and not intended to limit the invention solely to the embodiments described herein, will best be understood in conjunction with the accompanying drawings, wherein.

DETAILED DESCRIPTION OF THE INVENTION

A detailed description of embodiments of the present invention is provided in the following.

The major idea of the present invention is to add a diagnostic circuit for aiding in detection of when an oscillating signal is ready for use.

Figure 1A:
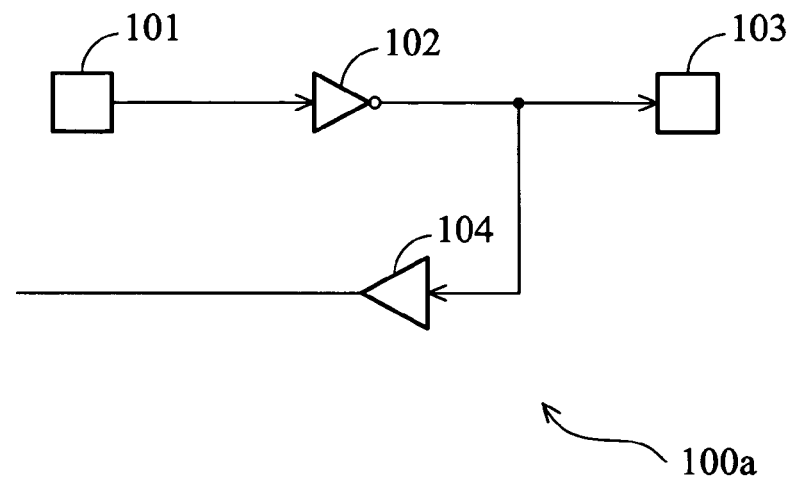
FIG. 1a to FIG. 1d are block diagrams of conventional clock generators.
Figure 1B:
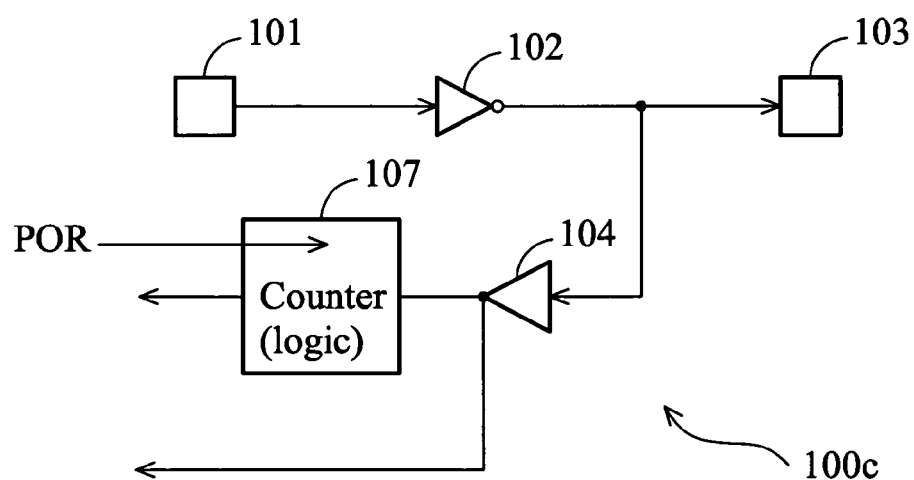
Figure 1C:
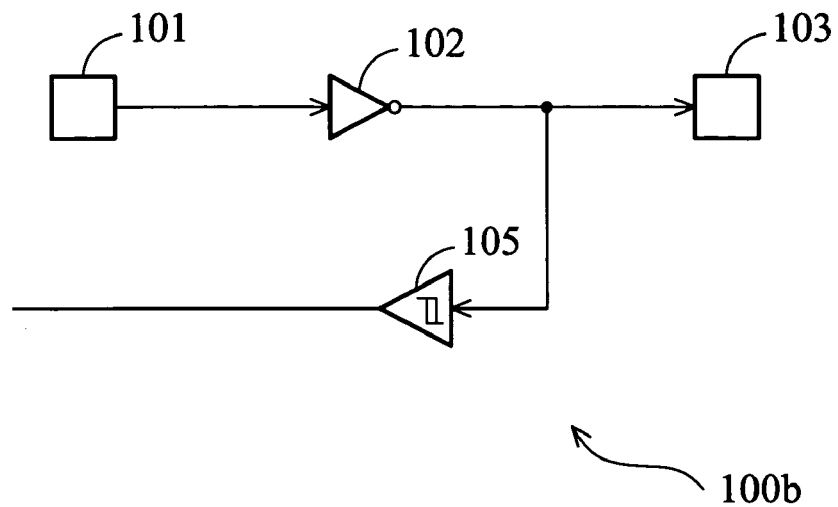
Figure 1D:
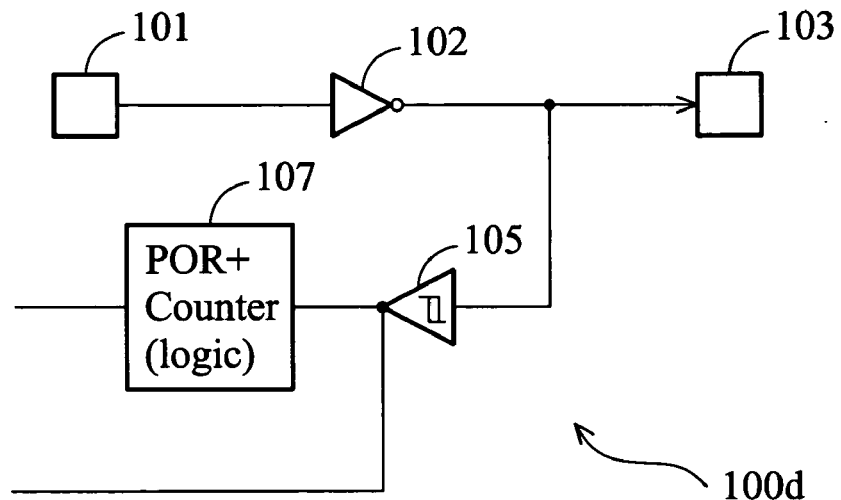
Figure 2A:
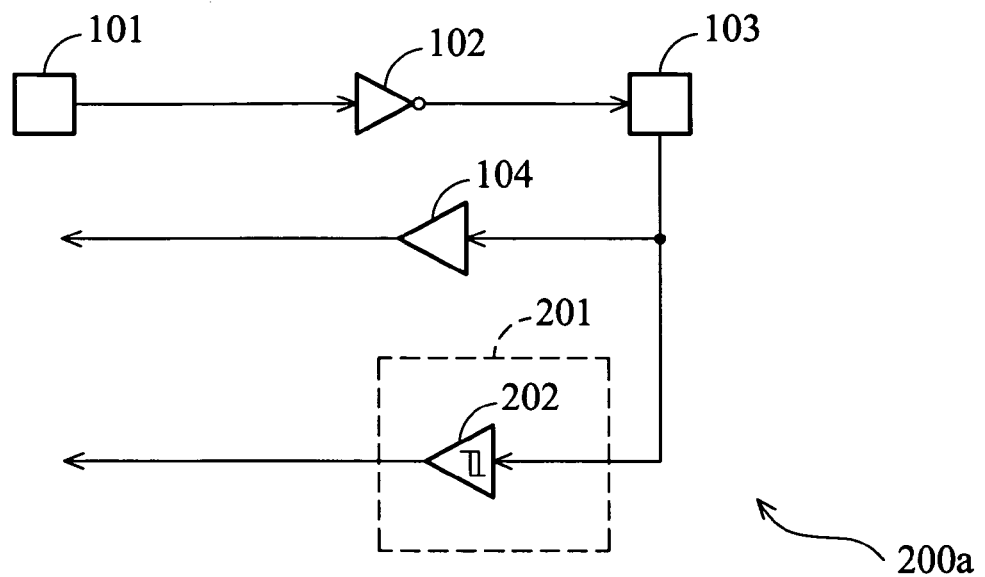
FIG. 2a to FIG. 2d are block diagrams of clock generators according to embodiments of the present invention.

As shown in FIG. 2a, in a crystal pad 200a, the input pad 101, amplifier 102, output pad 103 and shaping circuit 104 are analogous to FIG. 1a. In addition, a diagnostic circuit 201 comprising a large hysteresis 202 is coupled to output pad 103. the large hysteresis 202 can be a large hysteresis circuit, for detecting the amplitude of the sinusoidal wave output from amplifier 102. While the added structure is arranged as an extension to the conventional circuit, the shaping circuit 104 can be comprised a small hysteresis circuit or Schmitt trigger, avoiding impact from power bouncing, and the large hysteresis 202 can therefore perform accurate ready detection without false counting issues due to small hysteresis.

Figure 3:
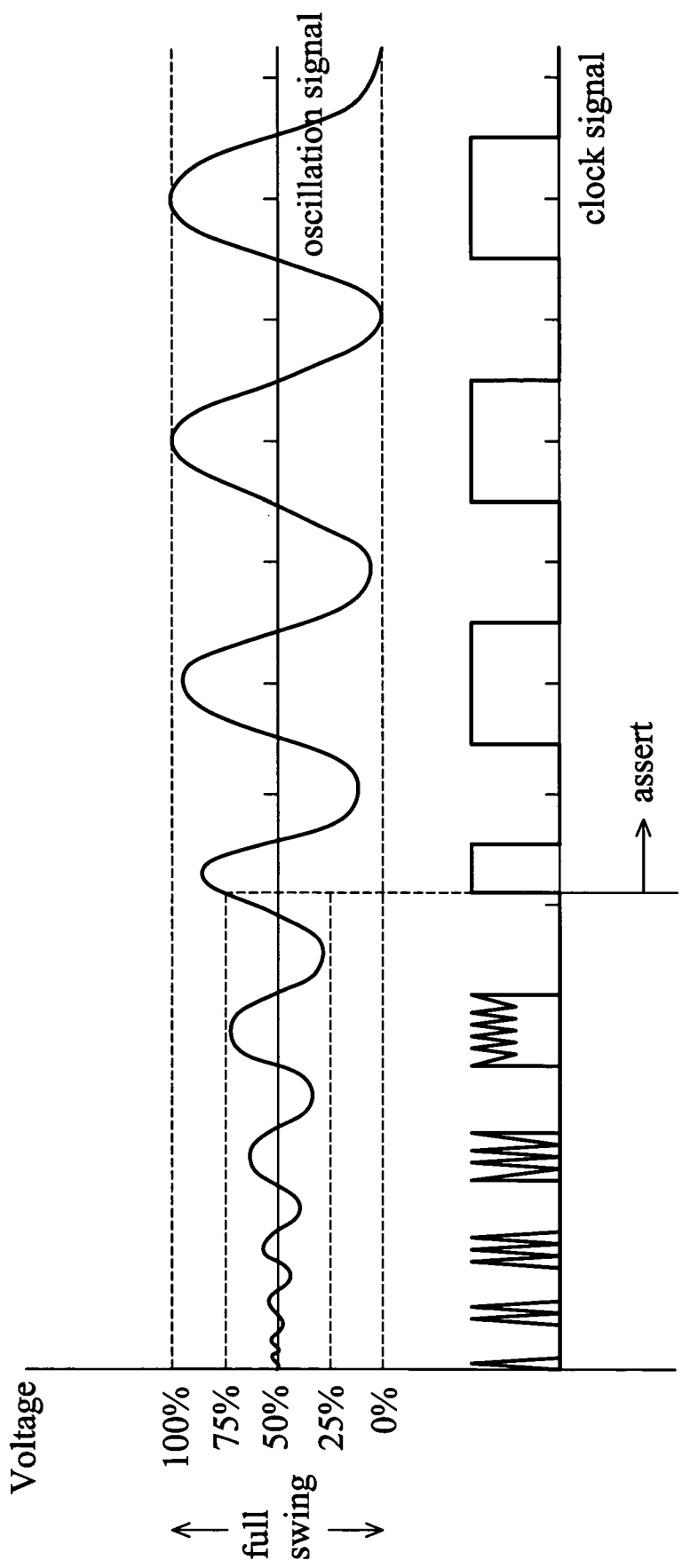
FIG. 3 is a detailed diagram of a signal transition curve for FIG. 2a to FIG. 2d.

As shown in FIG. 3, when the clock generator is powered on, the oscillating signal, appears as a sinusoidal wave, begins to oscillate with gradually increasing amplitude, and finally becomes a full swing signal. In an embodiment of the present invention, when a top in the oscillating signal is higher than 75% and a bottom in the oscillating signal is lower than 25%, in comparison to the full swing voltage, the clock is determined to be ready, and the large hysteresis 202 asserts a ready signal, such that corresponding operations proceed by output and use of the square wave shown below.

Figure 2B:
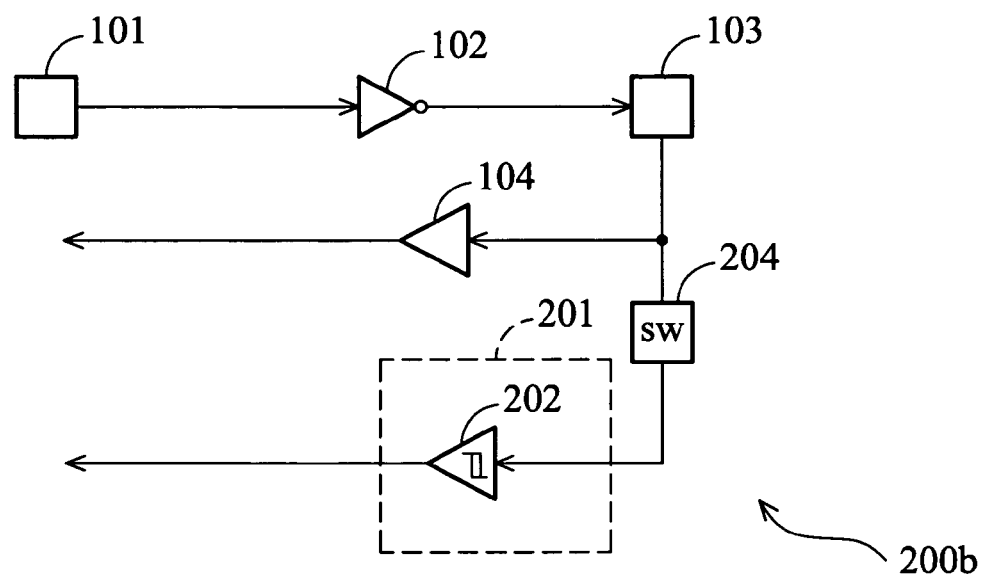

In FIG. 2b, a switch 204 is added. Since the diagnostic circuit 201 is used for ready detection only, it can be disabled after detection is complete by turning off the switch through some means, such as the ready signal itself (shown as FIG. 2c).

Figure 2C:
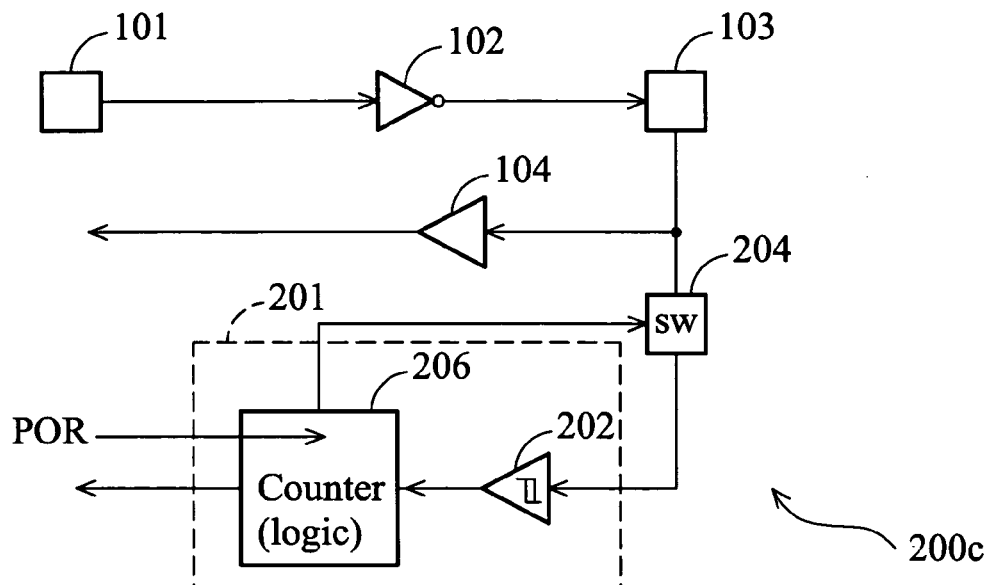

In FIG. 2c, according to another embodiment of the present invention, the diagnostic circuit 201 further comprises a counter logic 206, for counting transitions of the amplitude detection result output from large hysteresis 202. Thus signal readiness can be, determined either by the amplitude size, or the number of transitions of the amplitude being more than a predetermined value. Since the large hysteresis 202 is designed to be a large hysteresis circuit, no miss counting problems will occur, ensuring more reliable detection, and since the oscillating signal is transformed to the desired square wave through shaping circuit 104, rather than large hysteresis 202, no unbalanced duty-cycle problems due to ground bouncing will occur. When the ready signal is asserted by counter logic 206, the switch 204 simultaneously turns off to disable the diagnostic circuit 201 (including large hysteresis 202 and counter logic 206).

Figure 2D:
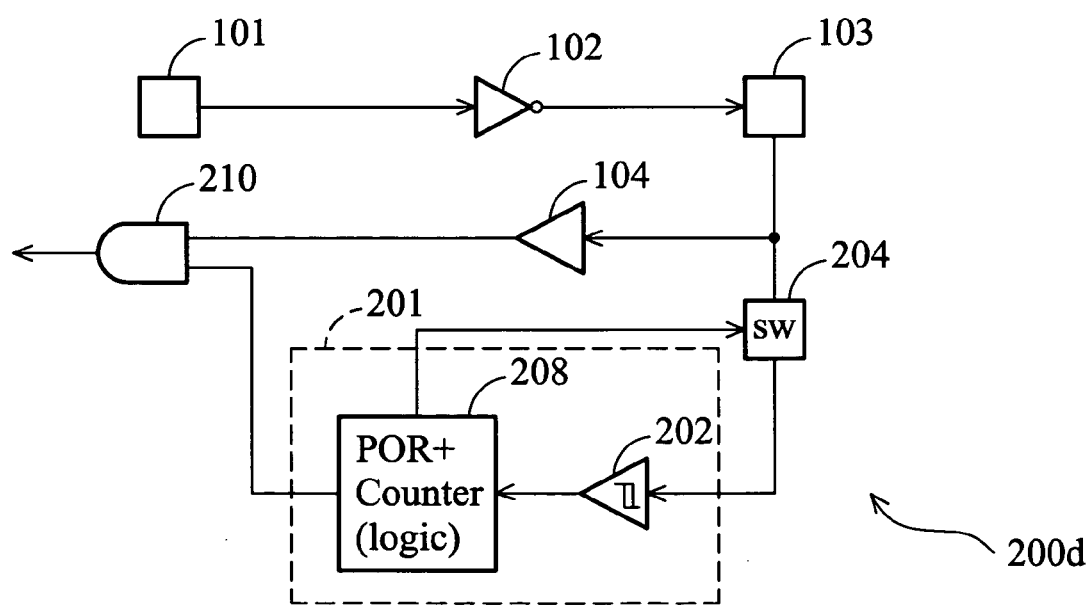

FIG. 2d shows another embodiment of the present invention; wherein an AND-gate 210 is added to control the output of the crystal pad 200d. The AND-gate 210 will not be enabled to output the square wave until receiving the ready signal asserted from POR counter logic 208. In other words, this clock generator will not output undesired glitches or inaccurate clock signals under the control of AND-gate 210. Once the AND-gate 210 is enabled, a ready clock signal can be output for instant use.

A power on reset (POR) can be applied externally to reset the counter logic 206 at power on, and alternatively as shown in POR counter logic 208 of FIG. 2d, the POR can be a built-in feature.

In summary, the present invention provides an accurate and efficient circuit for detecting whether a clock generator is ready. The added structure, diagnostic circuit comprising a large hysteresis circuit, is an extension to the conventional circuit for detecting the amplitude of the oscillating signal. Thus embodiments of the invention prevents false counting and unbalanced duty-cycles, and the diagnostic circuit can be disabled after the detection is completed, and conventional bottlenecks can be eliminated.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A clock generator with activation control, for generating a clock signal, comprising:
   an amplifier capable of being coupled to an external oscillation source through an input pad and an output pad to generate an oscillating signal;
   a shaping circuit capable of being coupled to the output pad, for shaping the oscillating signal to generate a clock signal; and
   a diagnostic circuit capable of being coupled to the output pad, for asserting a ready signal when amplitude of the oscillating signal exceeds a predetermined portion of a full swing voltage;
   a switch, coupled to the diagnostic circuit, for disabling the diagnostic circuit when the ready signal is asserted.

2. The clock generator as claimed in claim 1, wherein the predetermined portion is 50%.

3. The clock generator as claimed in claim 1, wherein diagnostic circuit asserts the ready signal when a top in the oscillating signal is higher than 75% and a bottom in the oscillating signal is lower than 25%.

4. The clock generator as claimed in claim 1, wherein the diagnostic circuit comprises:
   a first hysteresis circuit for detecting whether the amplitude of the oscillating signal exceeds the predetermined portion and accordingly generating a result; and
   a ready controller for asserting the ready signal according to the result.

5. The clock generator as claimed in claim 4, wherein the first hysteresis circuit is a Schmitt trigger.

6. The clock generator as claimed in claim 4, wherein the shaping circuit is a second hysteresis circuit with lower hysteresis threshold than the first hysteresis circuit.

7. The clock generator as claimed in claim 4, wherein the ready controller comprises a counter logic for counting the transition of the result and asserting the ready signal when the number of the transition exceeds a predetermined number.

8. The clock generator as claimed in claim 7, wherein the ready controller further comprises a power on reset (POR) for resetting the counter logic at power on.

9. The clock generator as claimed in claim 4 further comprises a gate for outputting the clock signal when the ready signal is asserted and for blocking the clock signal when the ready signal is deasserted.

10. A method for generating a clock signal with activation control, comprising the following steps:
    generating an oscillating signal;
    shaping the oscillating signal to generate a clock signal;
    providing a diagnostic circuit for detecting amplitude of the oscillating signal;
    asserting a ready signal when amplitude of the oscillating signal exceeds a predetermined portion of a full swing voltage;
    providing a switch to disable the diagnostic circuit when the ready signal is asserted; and
    outputting the clock signal when the ready signal is asserted.

11. The method as claimed in claim 10, wherein the predetermined portion is 50%.

12. The method as claimed in claim 10, wherein the ready signal is asserted when a top in the oscillating signal is higher than 75% and a bottom in the oscillating signal is lower than 25%.

13. The method as claimed in claim 10, further comprising counting transition of amplitude of the oscillating signal and asserting the ready signal when the number of transitions exceeds a predetermined number.

14. The method as claimed in claim 13, further comprising resetting the number of transetions at power on.

* * * * *